United States Patent
Kanou

(10) Patent No.: US 7,443,243 B2
(45) Date of Patent: Oct. 28, 2008

(54) HIGH FREQUENCY AMPLIFIER HAVING AN ATTENUATOR

(75) Inventor: Hideki Kanou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/898,003

(22) Filed: Sep. 7, 2007

(65) Prior Publication Data

US 2008/0018403 A1    Jan. 24, 2008

Related U.S. Application Data

(63) Continuation of application No. PCT/JP2005/004047, filed on Mar. 9, 2005.

(51) Int. Cl.
*H03G 3/00* (2006.01)
(52) U.S. Cl. ...................................... 330/284
(58) Field of Classification Search ................. 330/284
See application file for complete search history.

(56) References Cited

U.S. PATENT DOCUMENTS 4,839,611 A * 6/1989 Kukulinsky ................. 330/284
5,994,965 A * 11/1999 Davis et al. .................. 330/295
6,198,349 B1 * 3/2001 Kanno et al. ................. 330/282
7,199,664 B2 * 4/2007 Bult et al. .................... 330/284
2005/0030094 A1 * 2/2005 Conrad et al. ............... 330/144

FOREIGN PATENT DOCUMENTS

| JP | 59-67703 A | 4/1984 |
| JP | 62-151006 A | 7/1987 |
| JP | 2000-174650 A | 6/2000 |
| JP | 2000-508497 A | 7/2000 |
| JP | 2002-094408 A | 3/2002 |
| JP | 2002-344266 A | 11/2002 |
| WO | 98/19477 A1 | 5/1998 |
| WO | 99/59243 A1 | 11/1999 |

* cited by examiner

*Primary Examiner*—Robert J. Pascal
*Assistant Examiner*—Krista M Flanagan
(74) *Attorney, Agent, or Firm*—Arent Fox LLP

(57) ABSTRACT

An amplifier for amplifying a reception signal, having an input terminal for inputting the reception signal from an antenna, has a grounded gate transistor of which gate is grounded in a high frequency manner and of which source is connected to the input terminal, a load element disposed between the drain of the transistor and a power supply, an output terminal connected to a connection node between the drain and the load element, and an attenuator selectively inserted between the drain and the output terminal.

16 Claims, 7 Drawing Sheets

Principle of the present invention

Second embodiment

Third embodiment

FIG.8(A) At the time of amplification operation
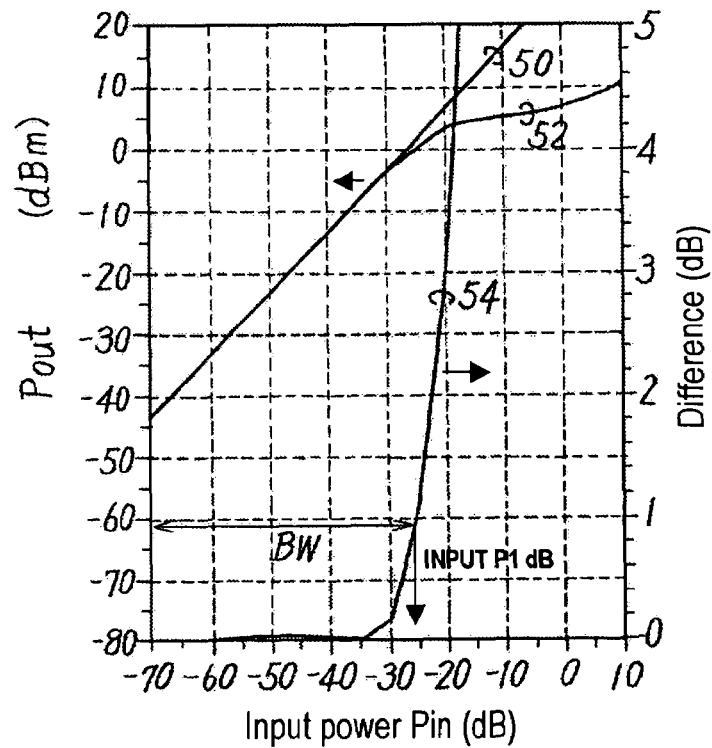
FIG.8(B) At the time of attenuation operation
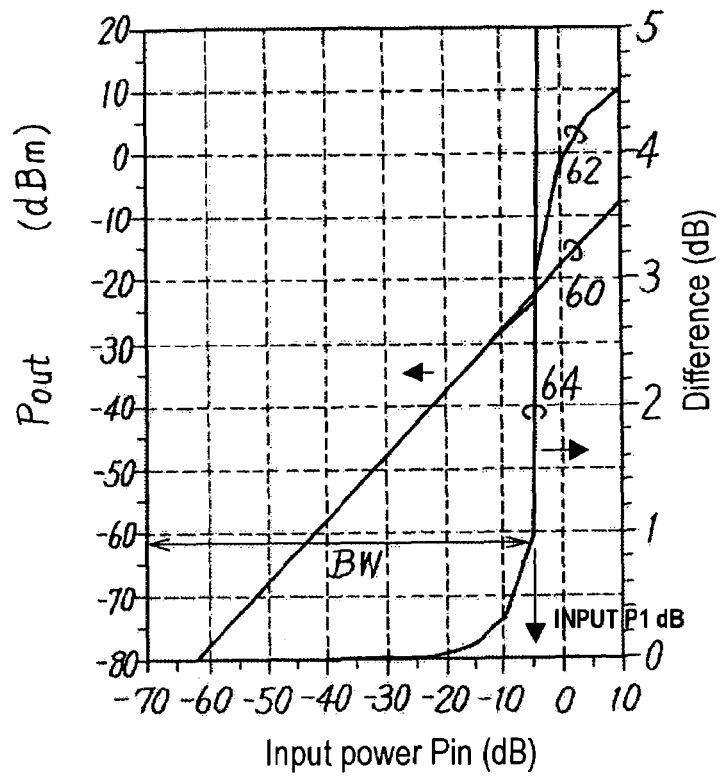

HIGH FREQUENCY AMPLIFIER HAVING AN ATTENUATOR

CROSS REFERENCE TO RELATED APPLICATIONS

This application is a continuation of International Application No. PCT/JP2005/004047, filed on Mar. 09, 2005, now pending, herein incorporated by reference.

FIELD OF THE INVENTION

The present invention relates to a high frequency amplifier having an attenuator, and more particularly a high frequency low noise amplifier having an attenuator and being provided in a front-end circuit on an antenna side of a radio receiver unit.

BACKGROUND OF THE INVENTION

In the front end of a radio receiver unit, a high frequency low noise amplifier is provided for amplifying a reception signal. For the above high frequency low noise amplifier, it is required to amplify the amplitude of a minute reception signal being input from a receiving antenna with the suppression of an increase of noise, and also to have predetermined impedance. The receiving antenna may receive an input signal having large power, other than a minute reception signal. Therefore, in order to attenuate such the input signal having large power, it is necessary to provide an attenuator in the amplifier.

Meanwhile, in recent years, it is proposed to configure a front-end circuit using a CMOS circuit, which is realized by a common chip to a circuit provided in a succeeding stage for digitally processing a baseband signal. By configuring both the front-end circuit and the digital processing circuit using CMOS circuits, it is possible to obtain a single chip configuration, enabling large cost reduction.

FIGS. 1 and 2 shows configurations of the conventional front-end circuits. In the example shown in FIG. 1, a variable attenuator 14 is provided between an antenna 10 and a high frequency low noise amplifier 16. In the succeeding stage of low noise amplifier 16, there is provided a mixer 18 to multiply a signal from a local oscillator 20, and thereby a high frequency input signal is converted to an intermediate frequency signal or a baseband signal. Variable attenuator 14 is variably controlled either to attenuate or not to attenuate, in response to a feedback control signal 22 from the succeeding stage. When an input having large power is received, variable attenuator 14 performs attenuation, so as to prevent low noise amplifier 16 from saturation. When an input having an ordinary level is received, attenuator 14 does not perform attenuation, and the received signal is input to low noise amplifier 16 intact, without being attenuated by variable attenuator 14. Such the prior art is described in Patent document 1.

In the example shown in FIG. 2, a low noise amplifier 16 and an attenuator 15 are provided in parallel, and there is performed a switchover between a case of supplying the reception signal to mixer 18 via low noise amplifier 16 and a case of supplying to mixer 18 via attenuator 15 by means of a switch SW. The switch SW is controlled to switch over by a feedback control signal 24 fed from the succeeding stage. When an input having large power is received, the switchover is made to the attenuator 15 side, so that attenuator 15 performs attenuation. Meanwhile, when an input of an ordinary level is received, the switchover is made to the low noise amplifier 16 side, so that the reception signal is amplified by low noise amplifier 16. Such the prior art is described in Patent documents 2 and 3.

In the exemplary circuit shown in FIG. 1, a noise factor NF is deteriorated because variable attenuator 14 constituted of an element which becomes a thermal noise source is provided in the preceding stage of low noise amplifier 16. Variable attenuator 14 is configured of, for example, a T-shaped circuit of resistance elements, and for a resistance value R, thermal noise of $<v>^2=4$ kTR (T is temperature) is produced. Therefore, with the provision of the above variable attenuator 14, undesirably the above thermal noise is added to the input signal of low noise amplifier 16. Even when the noise produced by amplifier 16 is low, if the thermal noise is added to the input signal, an overall noise factor (the ratio between the S/N ratio of the input signal and the S/N ratio of the output signal) is deteriorated. Similarly, in the exemplary circuit shown in FIG. 2, a switch SW is provided in the preceding stage of low noise amplifier 16. The above switch SW is constituted of, for example, a MOS transistor, and the transistor is also a generation source of thermal noise. Therefore, in the case of FIG. 2, the noise factor is also deteriorated.

Patent document 1: Japanese Unexamined Patent Publication No. 2002-94408.
Patent document 2: Japanese Unexamined Patent Publication No. 2000-174650.
Patent document 3: Japanese Patent Application Publication No. 2000-508497.

SUMMARY OF THE INVENTION

According to a first aspect of the present invention, in an amplifier for amplifying a reception signal, having an input terminal for inputting the reception signal from an antenna, the amplifier includes: a grounded gate transistor of which gate is grounded in a high frequency manner, and of which source is connected to the input terminal; a load element disposed between the drain of the transistor and a power supply; and an output terminal connected to a connection node between the drain and the load element, and further the amplifier includes an attenuator selectively inserted between the drain and the output terminal.

BRIEF DESCRIPTION OF THE DRAWINGS

FIG. 8 shows a diagram illustrating the simulation results of an amplifier with an attenuator according to the present embodiment.

DESCRIPTION OF THE SYMBOLS

Tr1: Grounded gate transistor, IN: Input terminal, OUT: Output terminal, Tr2: Switch transistor, Tr3, Tr4: Switch transistors, ATT: Attenuator, R1: Load element

PREFERRED EMBODIMENTS

The preferred embodiments of the present invention are described hereinafter referring to the charts and drawings.

However, it is to be noted that the technical scope of the present invention is not limited to the embodiments described below, but encompasses items described in the appended claims and the equivalents thereof.

Figure 1:
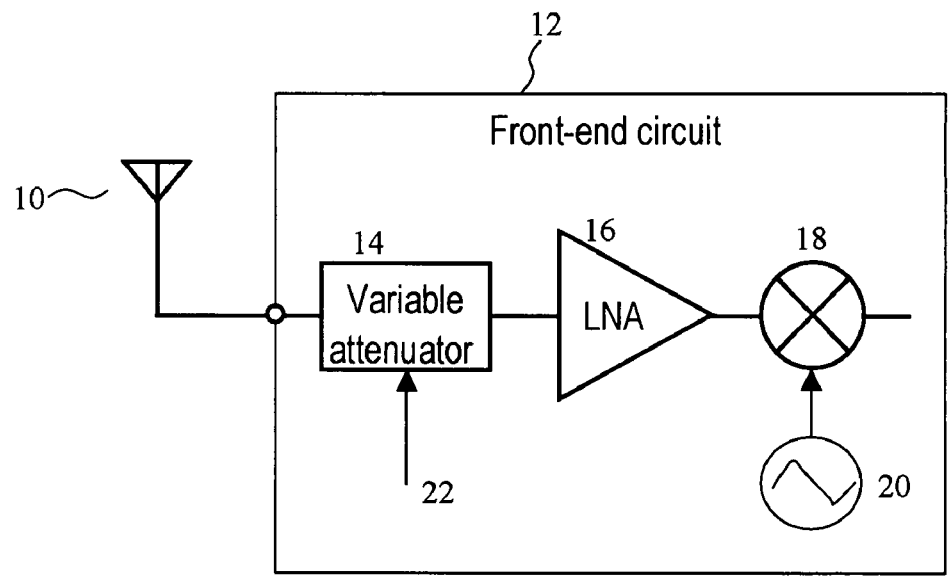
FIG. 1 shows a configuration diagram of the conventional front-end circuit.
Figure 2:
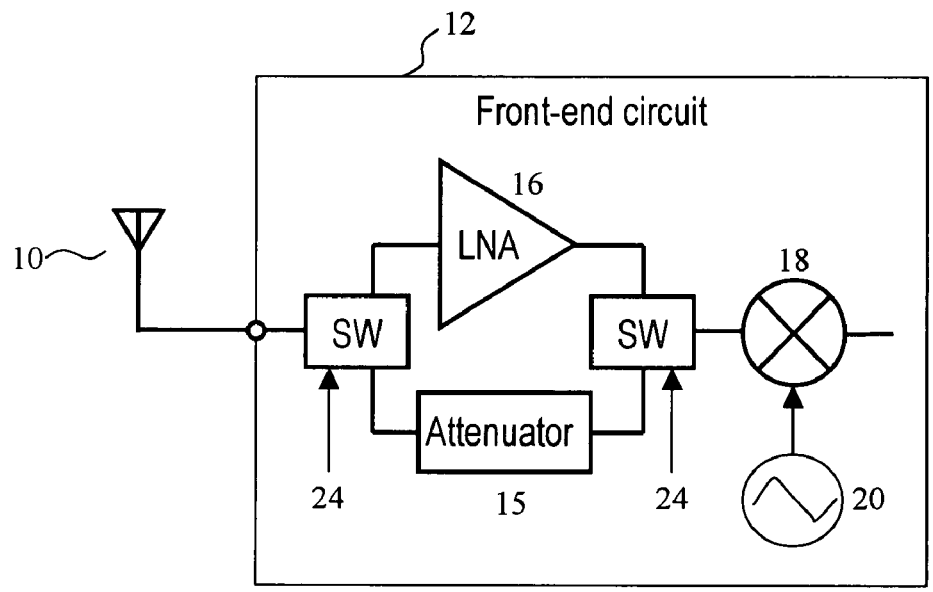
FIG. 2 shows a configuration diagram of the conventional front-end circuit.
Figure 3:
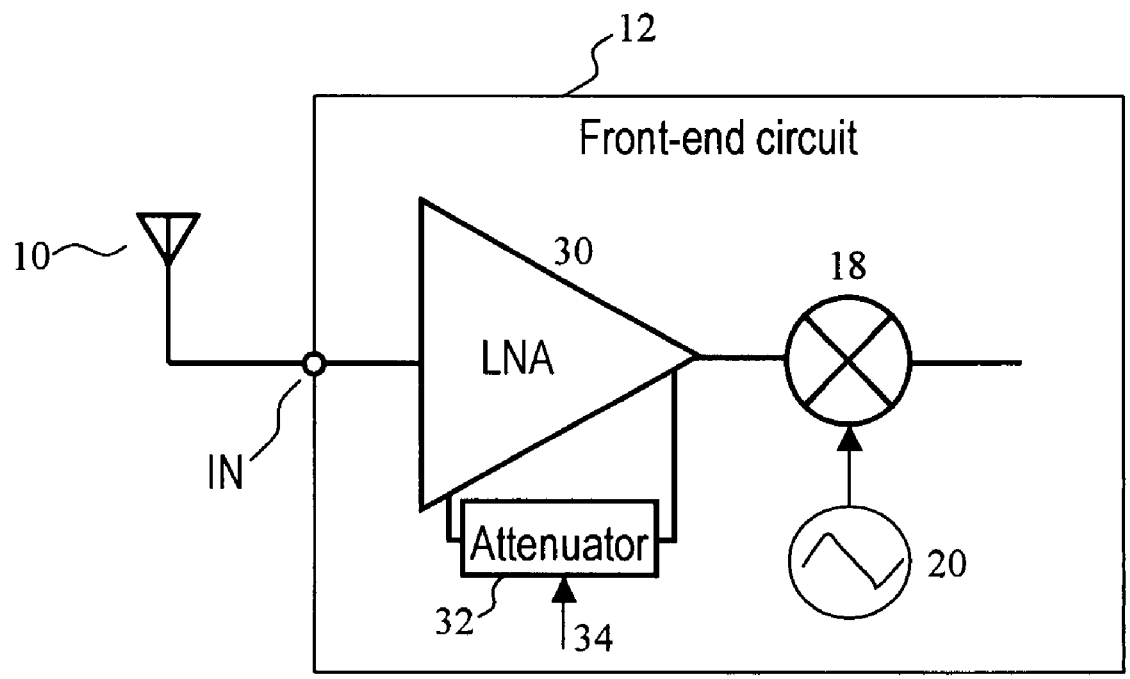
FIG. 3 shows a principle diagram of the present invention.

FIG. 3 shows a principle diagram of the present invention. A high frequency low noise amplifier 30 connected to an antenna 10 includes an attenuator 32 inside thereof. Between an input terminal IN and antenna 10, neither an attenuator nor a switch element for inserting the attenuator is provided. In response to a feedback control signal 34 from the succeeding stage, attenuator 32 inserts or inhibits to insert an attenuation function into amplifier 30. The output of amplifier 30 is supplied to, for example, a mixer 18, so as to be frequency converted therein.

Figure 4:
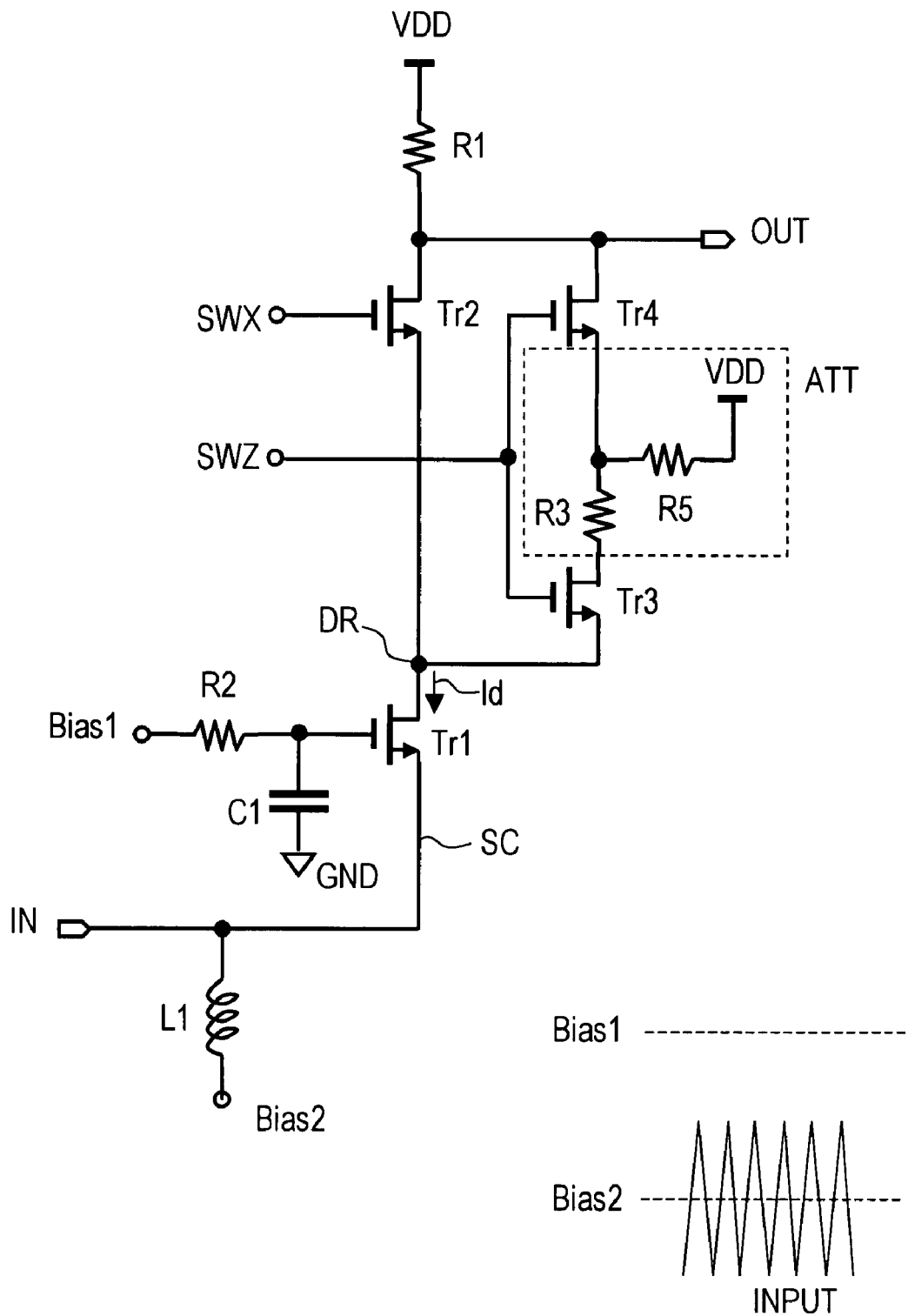
FIG. 4 shows a circuit diagram of a high frequency low noise amplifier according to a first embodiment.

FIG. 4 shows a circuit diagram of a high frequency low noise amplifier according to a first embodiment. The above high frequency amplifier includes an amplifier circuit using a grounded gate transistor Tr1, and an attenuator ATT. The gate of the amplification transistor Tr1 is connected to a first bias voltage Bias1 via a resistor R2, and also to a ground terminal GND via a capacitor C1, respectively, thus being grounded in a high frequency manner. In an ideal circuit, the above first bias voltage Bias1 has sufficiently low impedance in a signal frequency band, and in such the case, the gate of the transistor Tr1 is directly connected to the first bias voltage Bias1, making unnecessary the circuits of the resistor R2 and the capacitor C1. Also, because the impedance of the capacitor C1 appears to be high in a low frequency band, it is better to eliminate the resistor R2 and the capacitor C1 in such the case. Also, the source SC of the transistor Tr1 is connected to the input terminal IN, and also to a second bias voltage Bias2 via an inductor L1. Further, the drain DR of the transistor Tr1 is connected to a power supply VDD, via a load element constituted of a switch transistor Tr2 and a resistor R1. Further, an output terminal OUT is provided at the connection point of the load element R1 and the drain DR. The above switch transistor Tr2 is a grounded gate transistor, and as an amplifier, a cascade connection of the grounded gate transistors Tr1, Tr2 is configured.

Further, in the above high frequency amplifier, the attenuator ATT is inserted between the drain DR and the output terminal OUT, in a manner to sandwich two switch transistors Tr3 and Tr4. The attenuator ATT includes a resistor R3 disposed between the transistors Tr3, Tr4, and a resistor R5 connected to the power supply VDD.

In the above-mentioned high frequency amplifier, when a switch signal SWX is H level and SWZ is L level, the transistor Tr2 comes to conduct and the transistors Tr3, Tr4 do not conduct, and thereby the attenuator ATT is disconnected. Then, the grounded-gate amplification transistor Tr1 and the load element R1 function as a grounded gate amplifier. As shown in the lower right of FIG. 4, the relationship between the two bias voltages Bias1, Bias2 is Bias1>Bias2. The input signal INPUT is a signal of which amplitude swings centered on the second bias voltage Bias2. When the above input signal INPUT is input to the input terminal IN, the gate-to-source voltage of the amplification transistor Tr1 varies, and following the above variation, a drain current Id is varied. The drain current Id flows through the resistor R1, load element, and an output signal of which amplitude is amplified is generated on the output terminal OUT.

An amplification factor is determined by mutual conductance gm of the amplification grounded-gate transistor Tr1 and the load element R1. By adjusting the mutual conductance gm, the input impedance can be adjusted in a wide bandwidth to a desired value, for example, 50 Ω. Namely, when viewed from the input terminal IN, the input impedance has a value determined by the transistor Tr1, the switch transistor Tr2 and the load element R1, which is mainly determined by the reciprocal number (1/gm) of the mutual conductance gm of the transistor Tr1. Therefore, by adjusting the mutual conductance gm of the transistor Tr1, the input impedance can be adjusted to the desired value. The above mutual conductance gm has a small frequency characteristic, and therefore, the input impedance can be matched over a wide bandwidth. Thus, the grounded-gate amplification transistor alone can attain the amplification over a wide bandwidth.

Next, when the switch signal SWX is L level and SWZ is H level, the transistor Tr2 does not conduct, and the transistors Tr3, Tr4 conduct, and thus the attenuator ATT is connected. Namely, between the drain DR of the amplification transistor Tr1 and the output terminal OUT, the attenuator ATT constituted of the resistors R3, R5 is inserted. Here, the drain current Id varies with the input signal INPUT, and the above drain current Id also flows through the resistors R3, R5 of the attenuator ATT, in addition to the resistor R1, load element. With this, the signal amplitude at the output terminal OUT is suppressed and attenuated, and the saturation of the amplifier is suppressed even in the case of the input having large power.

Further, the attenuator ATT includes a resistor R5 connected to the power supply VDD, in parallel with the load element R1. With this, an increase of the input impedance caused by the insertion of the attenuator ATT is reduced, so that the input impedance is maintained at a desired value (for example, 50Ω). Namely, when viewed from the input terminal IN, the input impedance is determined from the transistor Tr1, the resistor R3, and the parallel resistors R5, R1. Accordingly, with the provision of the resistor R5 in parallel with the load resistor R1, it is possible to suppress an increase of the input impedance at the time of attenuation operation when the attenuator ATT being inserted.

Also, because the attenuator ATT is configured of the resistance elements R3, R5, it has little dependence of frequency. Namely, in the case of the resistance element, because the impedance thereof does not include a frequency component, the input impedance matching can be made over a wide bandwidth even at the time of the attenuation operation, therefore, it is possible to prevent signal deterioration caused by signal reflection at the input terminal.

Figure 5:
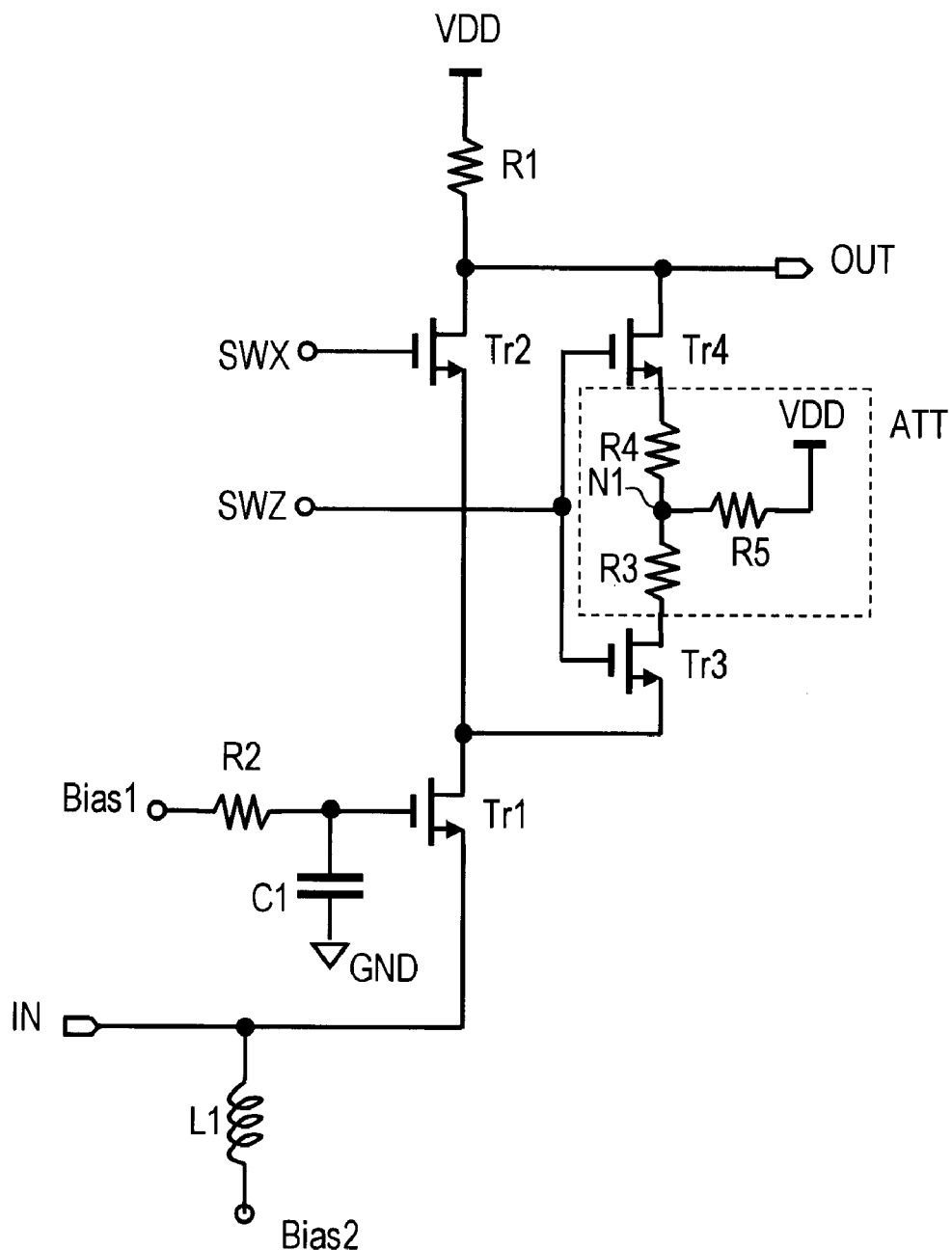
FIG. 5 shows a circuit diagram of a high frequency low noise amplifier according to a second embodiment.

FIG. 5 shows a circuit diagram of a high frequency low noise amplifier according to a second embodiment. In this example, the point of difference from the circuit shown in FIG. 4 is that the attenuator ATT includes a resistor R4 in addition to the resistors R3, R5. Other configurations are identical to the amplifier of FIG. 4.

At the time of the amplification operation when the transistor Tr2 conducts and the transistors Tr3, Tr4 do not conduct, the amplifier shown in FIG. 5 is identical to the amplifier shown in FIG. 4. Meanwhile, at the time of the attenuation operation when the transistor Tr2 does not conduct and the transistors Tr3, Tr4 conduct, the operation is as follows. First, a signal on the drain DR is attenuated by the resistance division by means of the resistors R3, R5, and the attenuated signal is generated at a node N1. Then, the attenuated signal at the node N1 is further attenuated by the resistors R4, R1, and the attenuated signal is generated on the output terminal OUT. Accordingly, by inserting the resistor R4, it is possible to further increase the attenuation factor, as compared with the operation at the time of attenuation shown in FIG. 4.

Also in the high frequency low noise amplifier shown in FIG. 5, amplification operation can be attained over a wide bandwidth, similar to the case of FIG. 4, and also input impedance matching can be performed over a wide bandwidth at the time of attenuation operation. Further, the deterioration of the noise factor can be prevented without provision of a terminal noise source, such as an attenuator and a switch, between the input terminal IN and the amplifier constituted of the transistors Tr1, Tr2 and the resistor R1.

Figure 6:
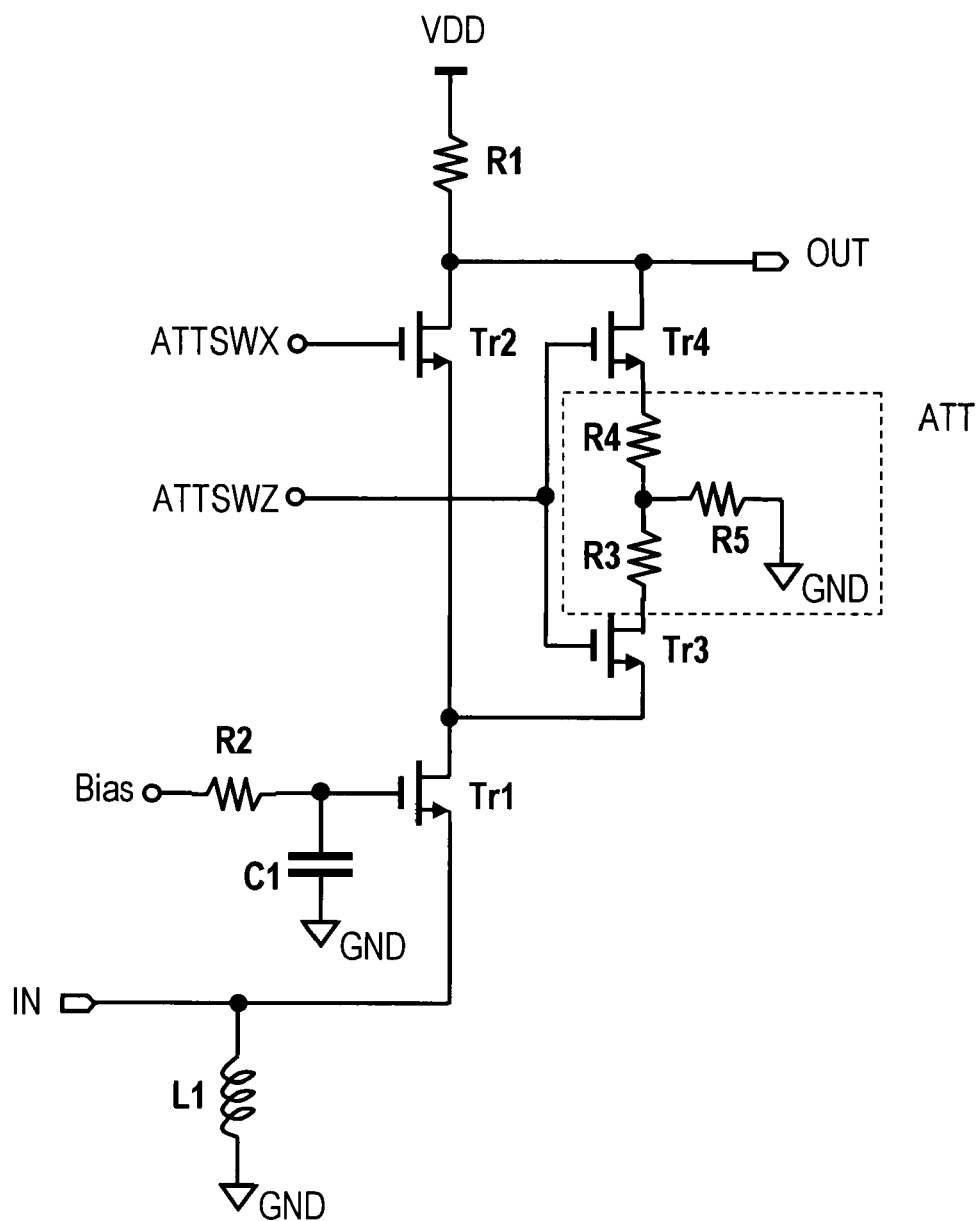
FIG. 6 shows a circuit diagram of a high frequency low noise amplifier according to a third embodiment.

FIG. 6 shows a circuit diagram of a high frequency low noise amplifier according to a third embodiment. In this example, the point of difference from the circuit shown in FIG. 5 is that the ground GND is connected to the resistor R5 of the attenuator. Other configurations are identical to FIG. 5. In such the circuit configuration, the resistor R5 is connected to the ground GND in place of the power supply VDD, but because both the power supply and the ground are power supplies of large capacity, the above connection is equivalent to the parallel connection of the resistors R1+R4 and the resistor R5 from the viewpoint of a small signal. Accordingly, it is possible to reduce the input impedance by means of the resistor R5. Also, the signal on the output terminal OUT is attenuated by means of the resistor R4. Further, by providing the resistor R3 also, the attenuation factor can be increased further. Even when the resistor R3 is omitted, attenuation can be made to some extent by means of the resistor R4.

Figure 7:
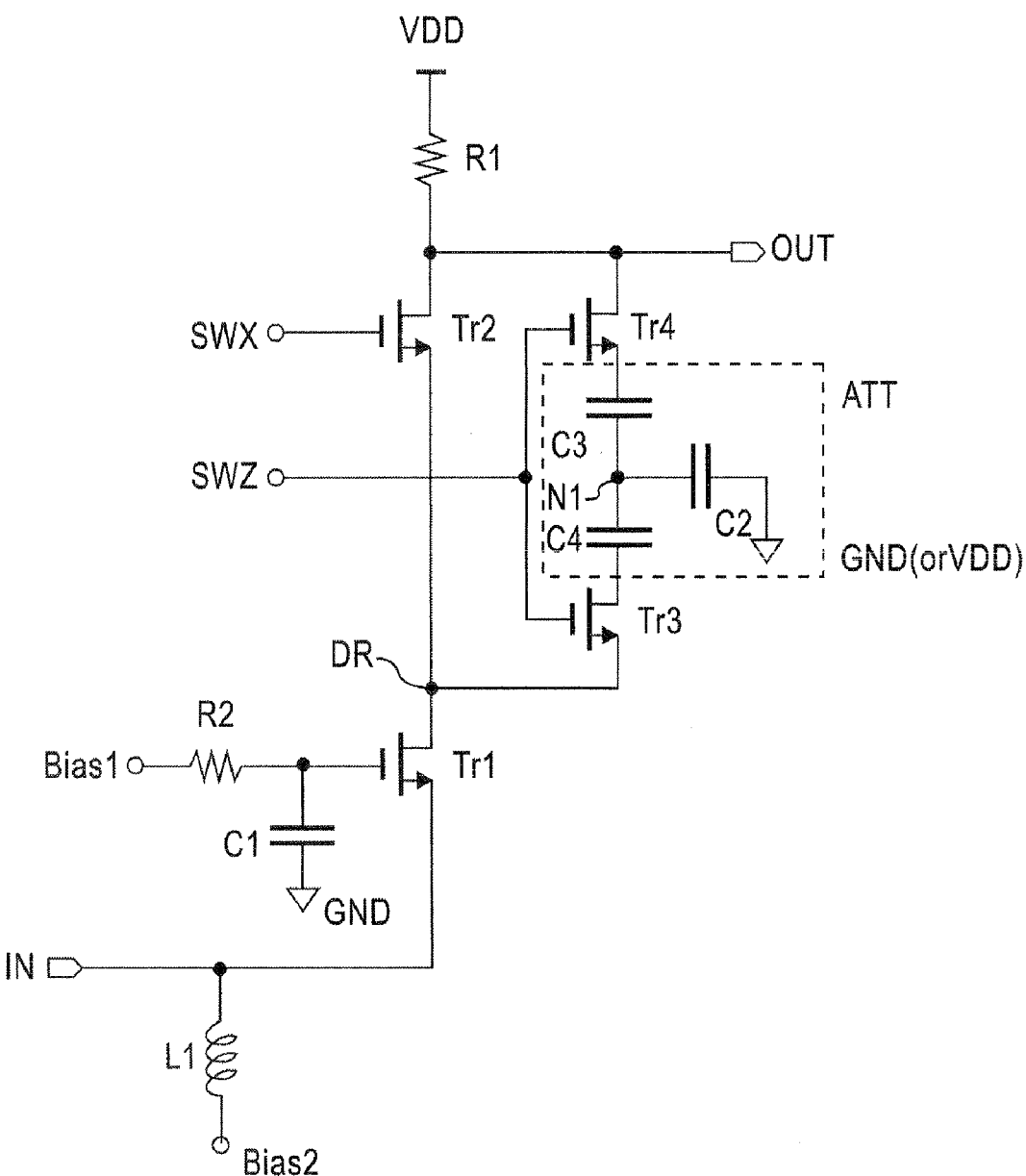
FIG. 7 shows a circuit diagram of a high frequency low noise amplifier according to a fourth embodiment.

FIG. 7 shows a circuit diagram of a high frequency low noise amplifier according to a fourth embodiment. In this circuit, the attenuator ATT is constituted of capacitors C4, C2 and C3, and the capacitor C2 is connected to the ground GND. The capacitor C2 may be connected to the power supply VDD in a similar manner to the first and the second embodiments. Because the ground GND and the power supply VDD are power supplies of large capacity, the above connection is equivalent to a grounded power supply from an AC point of view. Other configurations are identical to the amplifiers shown in FIGS. 4, 5.

Similar to FIGS. 4, 5, the above amplifier is operated as a grounded gate amplifier constituted of the transistors Tr1, Tr2 and the load element R1. The amplifier can perform low noise amplification over a wide bandwidth, and also the input impedance can be adjusted over a wide bandwidth through the adjustment of the mutual inductance of the transistor Tr1. Meanwhile, at the time of the attenuation operation, the attenuator ATT constituted of the three capacitors is inserted between the drain DR and the output terminal OUT. In this case, a signal on the drain DR is attenuated by the impedance division by means of the capacitors C4, C2 and then generated at the node N1. Then, the above signal at the node N1 is further attenuated by the impedance division by means of the resistor R1 and the capacitor C3, so that the attenuation signal is output to the output terminal OUT.

In the case of the fourth embodiment, because the attenuator ATT is configured of three capacitors, the impedance thereof has a frequency characteristic. Therefore, in the point of a narrowed frequency bandwidth in which the input impedance can be matched, the embodiment concerned is inferior to the examples shown in FIGS. 4, 5.

FIG. 8 shows a diagram illustrating the simulation results of an amplifier with an attenuator, according to the present embodiment. The embodiment is a high frequency low noise amplifier shown in FIG. 5. FIG. 8 (A) shows the characteristic of the input power versus the output power (Pin-Pout characteristic) at the time of amplification operation, while FIG. 8 (B) shows the characteristic of the input power versus the output power (Pin-Pout characteristic) at the time of attenuation operation. The horizontal axes represent the input power Pin, and the vertical axes represent the output power Pout, respectively. There is shown the difference between the characteristic of the input power versus the output power (Pin-Pout characteristic) and the ideal linear characteristic of the above power characteristic.

At the time of the amplification operation, as shown by a difference 54 between an input/output power characteristic 52 and an ideal linear characteristic 50, an input P1dB, i.e. input power producing the difference 54 of 1 dB is approximately −25 dBm. When the input power is not higher than the above input P1dB, input/output power characteristic 52 has a substantially linear characteristic. Also, at the time of the attenuation operation, as shown by a difference 64 between an input/output power characteristic 62 and an ideal linear characteristic 60, the input power Pin of the input P1dB is approximately −5 dBm. Apparently, it is possible to maintain a linear characteristic to the input having larger power as compared to the case of the amplification operation.

As having been described, according to the present embodiments, the noise factor is not deteriorated because of non-provision of a thermal noise source, such as an attenuator and a switch means, in the preceding stage of the amplifier circuit. Further, the input impedance can be matched over a wide frequency band at the time of the attenuation operation.

According to the embodiment, there is a configuration capable of selectively inserting the attenuator in the succeeding stage of the grounded gate transistor, by the intermediary of switches. Accordingly, because neither an attenuator nor a switch is provided between the input terminal and the antenna, there is no thermal noise source, and thus, the deterioration of the noise factor can be restrained.

In the above embodiment, a first switch transistor is disposed between the drain of the grounded gate transistor and the output terminal, a second switch transistor is disposed between the drain and the attenuator, and a third switch transistor is disposed between the attenuator and the output terminal, respectively, and the high frequency amplifier becomes an amplifier without attenuation when the first switch transistor is in a conducting state and the second and the third switch transistors are in a non-conducting state, while the high frequency amplifier becomes an amplifier with attenuation when the first switch transistor is in a non-conducting state and the second and the third switch transistors are in a conducting state.

In the above preferred embodiment, the attenuator includes a first impedance element disposed between the second and the third switch transistors, and a second impedance element disposed between the first impedance element and the power supply, and the second impedance element and the load element are connected in parallel.

In the above attenuator, further, a third impedance element may also be added between the first impedance element and the output terminal.

In the above-mentioned attenuator, the first, the second and the third impedance elements may be either resistance elements or capacitance elements. In particular, because of little dependence of frequency in the case of the resistance element, it is possible to adjust the input impedance to a desired value over a wide bandwidth.

Also, when a higher frequency signal is dealt with, an inductor may be used in place of the resistor, as the above-mentioned amplifier load element.

Since the attenuator is inserted between the drain and the output terminal, it becomes unnecessary to provide an attenuator and a switching element in the preceding stage of the input terminal, thus eliminating a thermal noise generation source, making it possible to prevent the deterioration of the noise factor. Moreover, because of a grounded gate amplifier using the grounded gate transistor, the input impedance can be adjusted over a wide bandwidth by adjusting mutual conductance gm (a ratio of the variation of a drain current to the variation of a gate voltage) of the transistor. Accordingly, in the low noise amplifier in accordance with the present invention, it is possible to set the input impedance to a desired value over a wide bandwidth.

INDUSTRIAL APPLICABILITY

The present invention is a high frequency low noise amplifier for receiving input signals over a wide bandwidth.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. An amplifier for amplifying a reception signal, having an input terminal for inputting the reception signal from an antenna, comprising:
   a grounded gate transistor of which gate is grounded in a high frequency manner and of which source is connected to the input terminal;
   a load element disposed between the drain of the transistor and a power supply;
   an output terminal connected to a connection node between the drain and the load element; and
   an attenuator having a first terminal and a second terminal, and the first terminal and the second terminals being selectively connected to the drain and the output terminal respectively.

2. The amplifier according to claim 1, further comprising:
   a first switch transistor disposed between the drain of the grounded gate transistor and the output terminal, a second switch transistor disposed between the drain and the first terminal of the attenuator, and a third switch transistor disposed between the second terminal of the attenuator and the output terminal,
   wherein the first switch transistor is in a conducting state when the second and the third switch transistors are in a non-conducting state.

3. The amplifier according to claim 2,
   wherein the attenuator comprises a first impedance element disposed between the second and the third switch transistors, and a second impedance element disposed between the first impedance element and the power supply.

4. The amplifier according to claim 3,
   wherein the attenuator further comprises a third impedance element disposed between the first impedance element and the output terminal.

5. The amplifier according to claim 4,
   wherein the first, the second and the third impedance elements are either resistance elements or capacitance elements.

6. The amplifier according to claim 1,
   wherein the gate of the grounded gate transistor is connected to the ground via a capacitance element, and also connected to a first bias voltage via a resistance element, and the source is connected to a second bias voltage via an inductor.

7. An amplifier for amplifying a reception signal, having an input terminal for inputting the reception signal from an antenna, comprising:
   a grounded gate transistor of which gate is grounded in a high frequency manner and of which source is connected to the input terminal;
   a load element disposed between the drain of the transistor and a power supply;
   an output terminal connected to a connection node between the drain and the load element;
   an attenuator selectively inserted between the drain and the output terminal;
   a first switch transistor disposed between the drain of the grounded gate transistor and the output terminal;
   a second switch transistor disposed between the drain and the attenuator; and
   a third switch transistor disposed between the attenuator and the output terminal,
   wherein the first switch transistor is in a conducting state when the second and the third switch transistors are in a non-conducting state.

8. The amplifier according to claim 7,
   wherein the attenuator comprises a first impedance element disposed between the second and the third switch transistors, and a second impedance element disposed between the first impedance element and the power supply.

9. The amplifier according to claim 8,
   wherein the attenuator further comprises a third impedance element disposed between the first impedance element and the output terminal.

10. The amplifier according to claim 9,
    wherein the first, the second and the third impedance elements are either resistance elements or capacitance elements.

11. The amplifier according to claim 7,
    wherein the gate of the grounded gate transistor is connected to the ground via a capacitance element, and also connected to a first bias voltage via a resistance element, and the source is connected to a second bias voltage via an inductor.

12. An amplifier for amplifying a reception signal, having an input terminal for inputting the reception signal from an antenna, comprising:
    a grounded gate transistor of which gate is grounded in a high frequency manner and of which source is connected to the input terminal;
    a load element disposed between the drain of the transistor and a power supply;
    an output terminal connected to a connection node between the drain and the load element; and
    an attenuator selectively inserted between the drain and the output terminal,
    wherein the gate of the grounded gate transistor is connected to the ground via a capacitance element, and also connected to a first bias voltage via a resistance element, and the source is connected to a second bias voltage via an inductor.

13. The amplifier according to claim 12, further comprising:
    a first switch transistor disposed between the drain of the grounded gate transistor and the output terminal, a second switch transistor disposed between the drain and the attenuator, and a third switch transistor disposed between the attenuator and the output terminal,
    wherein the first switch transistor is in a conducting state when the second and the third switch transistors are in a non-conducting state.

14. The amplifier according to claim 13,
    wherein the attenuator comprises a first impedance element disposed between the second and the third switch transistors, and a second impedance element disposed between the first impedance element and the power supply.

15. The amplifier according to claim 14, wherein the attenuator further comprises a third impedance element disposed between the first impedance element and the output terminal.

16. The amplifier according to claim 15, wherein the first, the second and the third impedance elements are either resistance elements or capacitance elements.

* * * * *